(12) United States Patent
Gong et al.

(10) Patent No.: US 10,004,160 B1
(45) Date of Patent: Jun. 19, 2018

(54) ADAPTIVE HEAT DISSIPATION

(71) Applicant: Futurewei Technologies, Inc., Plano, TX (US)

(72) Inventors: Jianmin Gong, Santa Clara, CA (US); Heng Wang, Shenzhen (CN); Shengping Li, Wuhan (CN); Zhicheng Ye, Wuhan (CN)

(73) Assignee: Futurewei Technologies, Inc., Plano, TX (US)

( * ) Notice: Subject to any disclaimer, the term of this patent is extended or adjusted under 35 U.S.C. 154(b) by 0 days. days.

(21) Appl. No.: 15/487,916

(22) Filed: Apr. 14, 2017

(51) Int. Cl.
*H05K 7/20* (2006.01)
*F28F 13/00* (2006.01)
(Continued)

(52) U.S. Cl.
CPC ......... *H05K 7/20454* (2013.01); *F28F 13/00* (2013.01); *G06F 1/20* (2013.01); *H01S 3/0405* (2013.01); *H05K 7/20* (2013.01); *H05K 7/2039* (2013.01); *H05K 7/20218* (2013.01); *H05K 7/20254* (2013.01); *H05K 7/20263* (2013.01); *H05K 7/20272* (2013.01); *F28D 1/00* (2013.01); *F28D 1/02* (2013.01); *F28F 3/00* (2013.01); *F28F 3/02* (2013.01);
(Continued)

(58) Field of Classification Search
None
See application file for complete search history.

(56) References Cited

U.S. PATENT DOCUMENTS 7,570,679 B2    8/2009   Gibson et al.
8,535,787 B1    9/2013   Lima
(Continued)

FOREIGN PATENT DOCUMENTS

CN    101212889 A    7/2008
CN    101730936 A    6/2010
(Continued)

OTHER PUBLICATIONS

"Materials and Coatings: Adaptive Thermal Management System", Technology Solution Brochure, National Aeronautics and Space Administration, NASA Technology Transfer Program: Bringing NASA Technology Down to Earth, www.nasa.gov, (2015), 2 pgs.
(Continued)

*Primary Examiner* — Dimary Lopez Cruz
*Assistant Examiner* — Zhengfu Feng
(74) *Attorney, Agent, or Firm* — Schwegman Lundberg & Woessner, P.A.

(57) ABSTRACT

An adaptive heat dissipation apparatus is provided, including two or more chamber walls forming a chamber volume having a first open side and a second open side, a heat source positioned at the first open side of the chamber volume, a heat conducting surface positioned at the second open side of the chamber volume, and a thermally-expansive material occupying a predetermined portion of the chamber volume. The thermally-expansive material expands to substantially fill the chamber volume at an ambient temperature above a predetermined temperature threshold and conducts heat from the heat source to the heat conducting surface. The thermally-expansive material contracts to leave an air gap when the ambient temperature is below the predetermined temperature threshold.

20 Claims, 2 Drawing Sheets

(51) Int. Cl.
*H01S 3/04* (2006.01)
*G06F 1/20* (2006.01)
H01L 23/34 (2006.01)
H01L 23/36 (2006.01)
H05K 1/02 (2006.01)
F28D 1/02 (2006.01)
F28D 1/00 (2006.01)
F28F 3/02 (2006.01)
F28F 3/00 (2006.01)

(52) U.S. Cl.
CPC ......... *F28F 2013/008* (2013.01); *H01L 23/34* (2013.01); *H01L 23/36* (2013.01); *H05K 1/0201* (2013.01)

(56) References Cited

U.S. PATENT DOCUMENTS

2009/0218087 A1    9/2009  Oshima
2010/0186938 A1    7/2010  Murata et al.
2015/0296659 A1*  10/2015  Desiano ............. H05K 7/20772
                                                                361/701

FOREIGN PATENT DOCUMENTS

| CN | 102594289 A | 7/2012 |
| CN | 103772992 A | 5/2014 |
| JP | 2013141022 A | 7/2013 |

OTHER PUBLICATIONS

Mack, Bonnie, et al., "Pluggable Optics Modules—Thermal Specifications, Part 1", Electronics Cooling Magazine [http://www.electronics-cooling.com/2016/07/pluggable-optics-modules-thermal-specifications-part-1], (Jul. 7, 2016), 7 pgs.

"International Application Serial No. PCT/CN2017/085374, International Search Report and Written Opinion dated Jan. 15, 2018", 12 pgs.

* cited by examiner

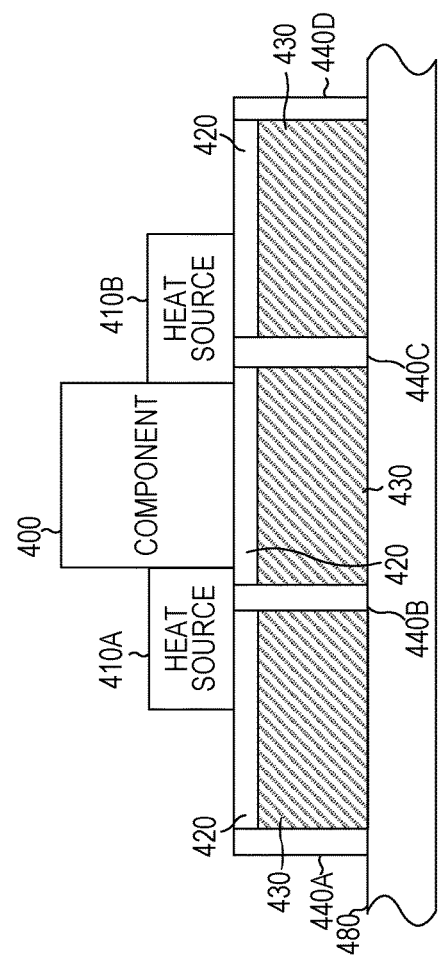
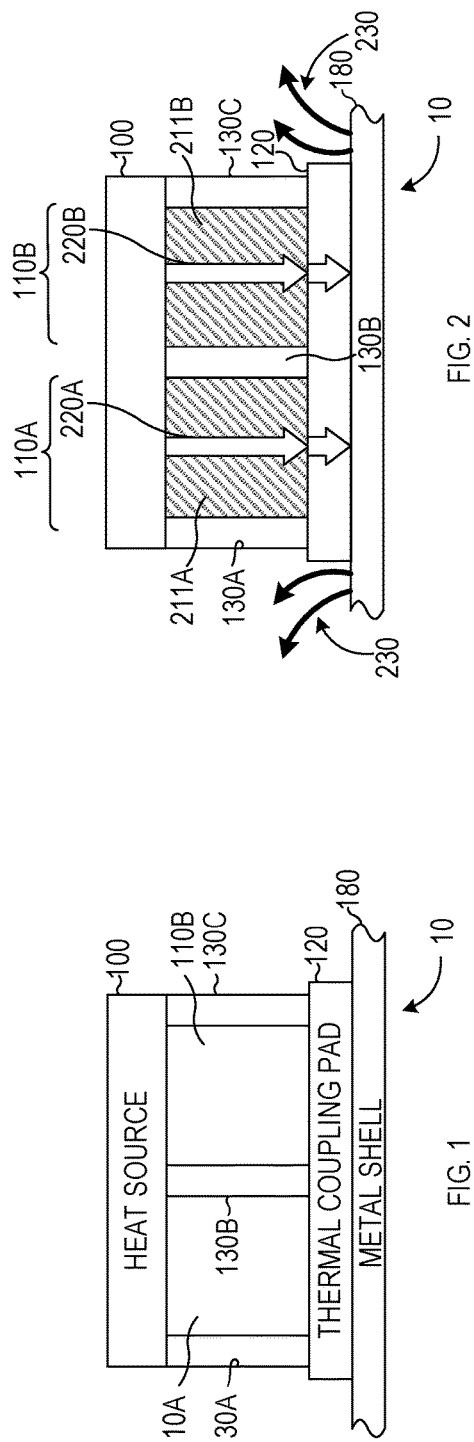
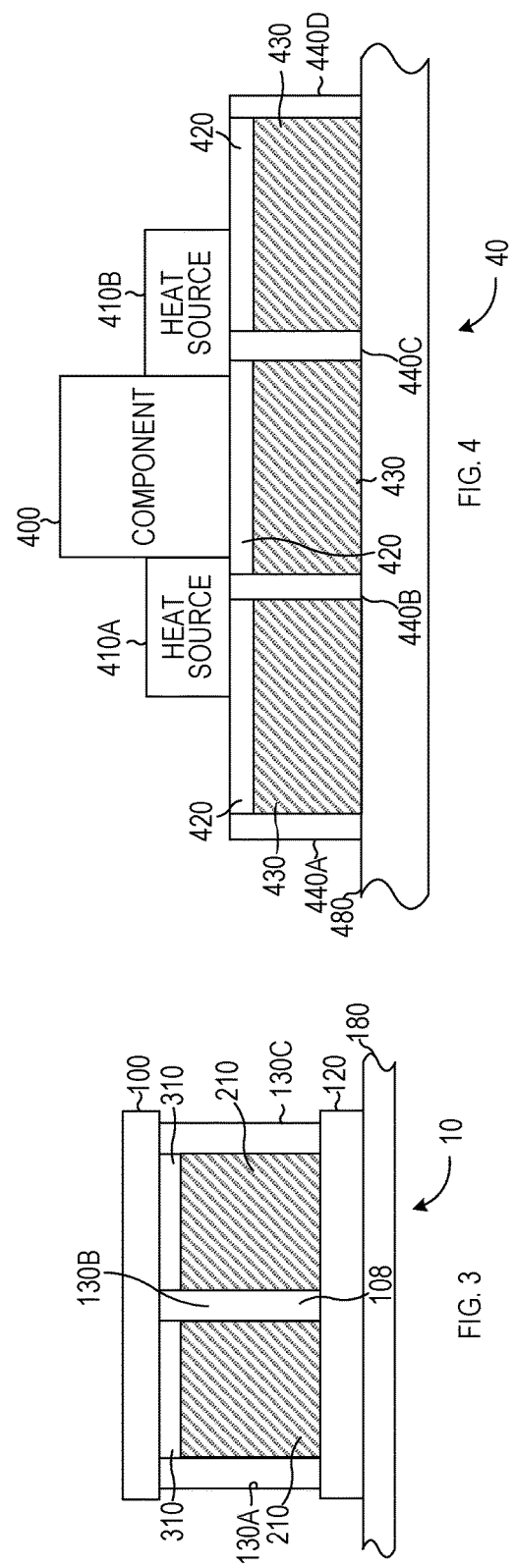

ADAPTIVE HEAT DISSIPATION

FIELD OF THE INVENTION

The present disclosure is related to heat dissipation, and in particular to adaptive heat dissipation based on ambient temperature.

BACKGROUND

Some electronic devices operate over an industrial grade temperature range (e.g., −40° C. to 85° C.). Electronic components that satisfy such broad temperature range are typically much more expensive than electronic components that operate over a commercial grade temperature range (e.g., 0° C. to 70° C.). Some electronic components may not even operate properly at relatively low temperatures (e.g., <0° C.).

Heating of the electronic components during low ambient temperatures helps to keep the components in a relatively-high temperature range for improved operation. However, energy may be wasted through a heat dissipation mechanism when the ambient temperature is relatively low. Also, the electronic components may be specially designed to retain heat, which also increase their cost.

SUMMARY

According to one aspect of the present disclosure, there is provided an adaptive heat dissipation apparatus that comprises: two or more chamber walls forming a chamber volume having a first open side and a second open side; a heat source positioned at the first open side of the chamber volume; a heat conducting surface positioned at the second open side of the chamber volume; and a thermally-expansive material occupying a predetermined portion of the chamber volume, with the thermally-expansive material expanding to substantially fill the chamber volume at an ambient temperature above a predetermined temperature threshold and conducting heat from the heat source to the heat conducting surface, with the thermally-expansive material contracting to leave an air gap when the ambient temperature is below the predetermined temperature threshold.

Optionally, in any of the preceding aspects, the thermally-expansive material comprises a thermal conductivity in a range of about 100-500 Watts per meter Kelvin (W/mK).

Optionally, in any of the preceding aspects, the thermally-expansive material comprises a positive coefficient of thermal expansion in a range of about 100-400 parts per million per degree Celsius (ppm/° C.).

Optionally, in any of the preceding aspects, the thermally-expansive material comprises a thermal gel or a silicone-based gel including a heat conducting agent substantially distributed within the silicone-based gel.

Optionally, in any of the preceding aspects, the heat conducting agent comprises a metallic powder or a diamond powder.

Optionally, in any of the preceding aspects, the two or more chamber walls comprise a thermal insulator material or an oxide thermal insulator material.

Optionally, in any of the preceding aspects, the heat conducting surface further comprises a metal shell or a thermal coupling pad thermally coupling the metal shell to the thermally-expansive material.

Optionally, in any of the preceding aspects, the thermal coupling pad comprises an elastic thermally-conductive coupling pad.

According to one aspect of the present disclosure, there is provided a circuit module that comprises: an electronics component; and an adaptive heat dissipation apparatus coupled to the electronics component, the adaptive heat dissipation apparatus comprising: two or more chamber walls forming a chamber volume having a first open side and a second open side; a heat source positioned at the first open side of the chamber volume and immediately adjacent to the electronics component; and a heat conducting surface positioned at the second open side of the chamber volume; a thermally-expansive material occupying a predetermined portion of the chamber volume, with the thermally-expansive material expanding to substantially fill the chamber volume at an ambient temperature above a predetermined temperature threshold and conducting heat from the heat source to the heat conducting surface, with the thermally-expansive material contracting to leave an air gap when the ambient temperature is below the predetermined temperature threshold.

Optionally, in any of the preceding aspects, the electronics component comprises an optics device.

Optionally, in any of the preceding aspects, the heat source is immediately adjacent and thermally coupled with a first side of the electronics component and further comprising a second heat source immediately adjacent and thermally coupled with a second side of the electronics component.

Optionally, in any of the preceding aspects, the thermally-expansive material comprises a thermal conductivity in a range of about 100-500 Watts per meter Kelvin (W/mK).

Optionally, in any of the preceding aspects, the thermally-expansive material comprises a thermal gel.

Optionally, in any of the preceding aspects, the thermally-expansive material comprises a positive coefficient of thermal expansion in a range of about 100-400 parts per million per degree Celsius (ppm/° C.).

Optionally, in any of the preceding aspects, the thermally-expansive material comprises a thermal gel or a silicone-based gel including a heat conducting agent substantially distributed within the silicone-based gel.

Optionally, in any of the preceding aspects, the heat conducting agent comprises a metallic powder or a diamond powder.

Optionally, in any of the preceding aspects, the two or more chamber walls comprise a thermal insulator material or an oxide thermal insulator material.

Optionally, in any of the preceding aspects, the heat conducting surface further comprises a metal shell or a thermal coupling pad thermally coupling the metal shell to the thermally-expansive material.

Optionally, in any of the preceding aspects, the thermal coupling pad comprises an elastic thermally-conductive coupling pad.

According to one aspect of the present disclosure, there is provided a method for manufacturing an adaptive heat dissipation apparatus that comprises: forming two or more chamber walls, with the two or more chamber walls forming a chamber volume having a first open side and a second open side; positioning a heat source at the first open side of the chamber volume; positioning a heat conducting surface at the second open side of the chamber volume; and filling a predetermined portion of the chamber volume with a thermally-expansive material, with the thermally-expansive material expanding to substantially fill the chamber volume at an ambient temperature above a predetermined temperature threshold and conducting heat from the heat source to the heat conducting surface, with the thermally-expansive material contracting to leave an air gap when the ambient temperature is below the predetermined temperature threshold.

Any one of the foregoing examples may be combined with any one or more of the other foregoing examples to create a new embodiment within the scope of the present disclosure.

BRIEF DESCRIPTION OF THE DRAWINGS

FIG. 1 is a diagram of an embodiment of an adaptive heat dissipation apparatus.

FIG. 2 is a diagram of an embodiment of the adaptive heat dissipation apparatus experiencing relatively high ambient temperatures.

FIG. 3 is a diagram of an embodiment of the adaptive heat dissipation apparatus experiencing relatively low ambient temperatures.

FIG. 4 is an embodiment of a circuit module including the adaptive heat dissipation apparatus.

DETAILED DESCRIPTION

Figure 6A:
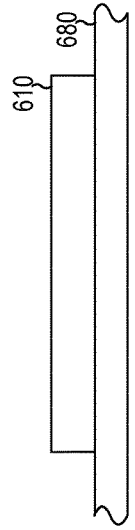
FIGS. 6A-6C are diagrams of various steps in manufacturing an embodiment of the adaptive heat dissipation apparatus.

Using a thermal material (e.g., thermal gel) with a relatively high coefficient of thermal expansion, an adaptive heat dissipation apparatus according to any of the embodiments of this disclosure dissipates heat under high ambient temperature and retains heat under low ambient temperature. The apparatus thus enables relatively inexpensive commercial grade components to be used under any ambient temperature range without the wasteful dissipation of heat under low ambient temperatures.

FIG. 1 is a diagram of an embodiment of an adaptive heat dissipation apparatus 10. The apparatus 10 includes two or more chamber walls 130A, 130B, and 130C that form one or more chamber volumes 110A and 110B. The chamber walls 130A, 130B, and 130C are formed of a thermal insulator material. The number of chamber walls can be varied, as needed or desired. Four such chamber walls may be included in some embodiments, forming a substantially rectangular shape. The chamber walls 130A, 130B, and 130C may be substantially planar in some examples, but alternatively could be curved, angled, or irregular. The chamber walls 130A, 130B, and 130C may be substantially parallel or may be non-parallel. The rectangular shape formed by the chamber walls 130A, 130B, and 130C is merely one example, and the apparatus 10 is not limited to any particular shape.

The apparatus 10 includes a first open side, shown at the top of the chamber walls in the figure, and includes a second open side, shown at the bottom of the chamber walls. The second open side is substantially opposite the first open side in some embodiments, but is not limited to such a configuration.

A heat source 100 is positioned at the top opening, adjacent to each of the chamber volumes 110A-110B (i.e., at the first open side). The heat source 100 may be coupled or affixed to, or merely held against, the tops of the chamber walls 130A, 130B, and 130C. It should be understood that the adaptive heat dissipation apparatus 10 can include any number of chamber volumes 110, and two chamber volumes 110A-110B are shown merely as an example.

An optional interior chamber wall 130B divides one chamber volume 110A from the other chamber volume 110B and provides support to keep the heat source 100 from contacting the heat conducting surface 180 when the apparatus flexes or distorts. Depending on the dimensions of the chamber volume, the interior chamber wall 130B may not be necessary. In such an embodiment, one chamber volume may be formed by the two or more outer chamber walls 130A and 130C. In some example embodiments, additional support walls are used to separate the heat source 100 from the heat conducting surface 180.

A heat conducting surface 180 is positioned at a bottom region of each of the chamber volumes 110A-110B (i.e., the second open side). The heat conducting surface 180 in some embodiments is a metal surface or structure having a thermal conductivity of at least 100 Watts per meter Kelvin (W/mK). The heat conducting surface 180 in some embodiments comprises a metal shell. In some embodiments, a thermal coupling pad 120 is coupled between the bottom regions or openings of the chamber volumes 110A-110B and the heat conducting surface 180.

A thermally-expansive material 211 occupies at least a portion of the chamber volumes 110A-110B. The thermally-expansive material 211 has a high (positive) coefficient of thermal expansion (CTE) in some embodiments. A high CTE indicates the thermally-expansive material will exhibit a large geometric or spatial expansion of the thermally-expansive material per unit of temperature increase. Further, a positive CTE indicates that the thermally-expansive material expands when experiencing increasing temperature, instead of contracting. In addition to being thermally expansive, expanding in proportion to temperature, the thermally-expansive material 211 also comprises a thermally-conductive material.

The chamber walls 130A-130C provide an enclosure for the thermally-expansive material 211A and 211B as well as support to separate the heat source 100 from the heat conducting surface 180. The chamber walls 130A-130C have low thermal conductivity properties (e.g., a thermal conductivity below 10 W/mK) so that the heat from the heat source 100 is not efficiently conducted to the heat conducting surface 180 through the chamber walls 130A-130C. However, the walls should be thin enough to enable ambient temperature to reach the thermally-expansive material 211A and 211B in the chamber volumes 110A-110B. The chamber walls 130A-130C may be formed, deposited, or grown using an oxide or a nitride insulator material such as silicon dioxide, silicon nitride, or some other form of insulator.

The thermally-expansive material 211 expands substantially in proportion to increasing temperature. Conversely, the thermally-expansive material 211 contracts substantially in proportion to decreasing temperature. The thermally-expansive material 211 is included within the chamber volume 110 in a proportion to leave an air gap, such as the air gap 310 or 650 between the top of the thermally-expansive material 211 (or 430) and the heat source 100 (or 410), as shown in FIG. 3 and FIG. 6C, for example. The air gap 310 or 650 is present when the ambient temperature of the adaptive heat dissipation apparatus 10 is relatively low. At relatively low ambient temperatures, the thermally-expansive material 211 occupies only a portion of the chamber volume 110. The air gap 310 (FIG. 3) or 650 (FIG. 6C) comprises a small proportion of the chamber volume 110, and it should be remembered that the figures are not necessarily to scale. The air gap 310 or 650 impedes or slows thermal conduction of heat from the heat source 100 to the thermal coupling pad 120 and/or to the metal shell 180.

It should be understood that gaps, channels, or other openings (not shown) may exist between the tops of the chamber walls 130 and the heat source 100. Consequently, air located within the chamber volume 110 can escape in some embodiments.

The thermally-expansive material 211A and 211B fills the chamber volumes 110A-110B such that an air gap separates the thermally-expansive material 211A and 211B from the heat source 100 during a first ambient temperature of the apparatus, and the thermally-expansive material 211A and 211B expands to contact the heat source 100 and the heat conducting surface 180 during a second ambient temperature that is greater than the first ambient temperature. The thermally-expansive material 211A and 211B has a relatively high coefficient of thermal expansion (CTE) (e.g., 100-400 parts per million per degree Celsius (ppm/° C.)) that enables it to expand when the ambient temperature is relatively high (e.g., >40° C.) and contract when the ambient temperature is relatively low (e.g., <40° C.). Other embodiments may use materials having different ranges of CTE that expand and contract at different temperature ranges.

It should be understood that operation of the adaptive heat dissipation apparatus 10 will depend on various factors, beyond just the ambient temperature. Operation of the adaptive heat dissipation apparatus 10 may depend on a proper fill level of the thermally-expansive material in the chamber volume(s). Operation of the adaptive heat dissipation apparatus 10 may depend on the expansion properties/CTE of the thermally-expansive material. Operation of the adaptive heat dissipation apparatus 10 may depend on the size of the air gap. Operation of the adaptive heat dissipation apparatus 10 may depend on a ratio/percentage of the thermally-expansive material to the air gap (or air gap depth in relation to the expansion properties/CTE of the thermally-expansive material. Likewise, a threshold temperature where the air gap is created or disappears can depend on one or more of the above factors. The threshold temperature therefore is not necessarily a fixed temperature point, and can be selected or designed into the adaptive heat dissipation apparatus 10. By proper selection of the thermally-expansive material, and the proper design of the dimensions of the chamber volume(s) and the dimensions of the air gap (such as at a designated or minimum ambient temperature), the threshold temperature can be set at a desired temperature point.

The thermally-expansive material 211 comprises a thermally-expansive gel in some embodiments. The thermally-expansive gel comprises a silicone-based gel including a heat conducting agent that is substantially distributed within the silicone-based gel. The heat conducting agent comprises a metallic power or a diamond powder.

In an embodiment, the thermally-expansive material 211A and 211B comprises a gel such as a silicone-based material. While silicone-based materials are not known for their high thermal conductivity, the sub-millimeter distance between the heat source 100 and the heat conducting surface 180 makes the lower thermal conductivity of silicon-based materials acceptable. A heat conducting agent, such as a metallic powder, metal oxide powder, metallic nano-particles, a diamond powder, or a graphite powder, may be added to the thermal gel and substantially distributed throughout the gel in order to increase the thermal conductivity of the gel. For example, the addition of the heat conducting agent may vary the thermal conductivity of the thermal gel within a range of 100-500 W/mK. Other embodiments may use different heat conducting agents to vary the thermal conductivity over a different range.

The heat conducting surface 180 may be a metal shell that is configured to conduct and dissipate heat away from the apparatus and into the ambient air surrounding the apparatus. The heat conducting surface 180 may be part of another electronics component and may be used as a shield for that component. For example, the heat conducting surface 180 may be electrically coupled to circuit ground to provide a shield around any electronic components within the heat conducting surface 180. In such an embodiment, the heat conducting surface 180 is at least partially electrically conductive, in addition to being heat conductive.

The thermal coupling pad 120 comprises a material that is intrinsically soft such that its thickness can reshape to fill any gaps between the heat conducting surface 180, the chamber volumes 110A-110B, and the chamber walls 130A-130C. For example, the thermal coupling pad 120 may include paraffin wax or silicone-based materials. The thermal coupling pad 120 may be relatively firm at lower temperatures but become soft and pliable at higher temperatures to substantially fill imperfections or hollows in the heat conducting surface 180. Thermal grease may be used as the thermal coupling pad 120. In another embodiment, the thermal coupling pad 120 is not used, so that the thermal gel is in direct contact with the heat conducting surface 180.

In some embodiments, the vertical separation between the heat source 100 and the thermal coupling pad 120 is relatively small, and the separation between the two components is exaggerated in the figure for clarity. In such embodiments, the thermally-expansive material 211A and 211B comprises a thin layer, and may occupy a smaller percentage of the chamber volume or volumes.

The apparatus embodiments illustrated in FIG. 1 and the following figures are not drawn to any scale. Various elements of the apparatus may be enlarged to better illustrate each particular element and to illustrate the adaptive heat dissipation concept using a thermally-expansive material 211A and 211B having a relatively high CTE. For example, in a practical scenario, the embodiment shown in FIGS. 1-3 may be wider and shorter than shown. In an embodiment, the distance from the heat source 100 to the thermal coupling pad 120 may be less than a millimeter (e.g., measured in microns) while the width of the apparatus may be many millimeters (e.g., 1 centimeter).

It should be understood that alternatively the orientation of the adaptive heat dissipation apparatus 10 could be changed, such as by placing the heat source 100 underneath the chamber walls 130 and the thermally-expansive material 211, and with the thermal coupling pad 120 and/or the metal shell 180 positioned above the chamber walls 130 and the thermally-expansive material 211, wherein the air gap would exist between the top of the thermally-expansive material 211 and the thermal coupling pad 120. Air can be drawn back into the chamber volume 110 as the thermally-expansive material 211 contracts with dropping ambient temperature.

FIGS. 2 and 3 illustrate an operation of the adaptive heat dissipation apparatus as described in FIG. 1. The operation includes the expansion and contraction of a thermally-expansive material 211A and 211B under different ambient temperatures. An ambient temperature may be defined as the temperature of the apparatus and its surroundings.

The illustrated amount of thermally-expansive material 211A and 211B, as well as the amount of expansion and contraction of the thermally-expansive material 211A and 211B in FIGS. 2 and 3, is exaggerated in order to illustrate the concept of the adaptive heat dissipation. Since air is an excellent insulator, simply removing contact of the thermally-expansive material 211A and 211B from the heat source 100 and thereby introducing an air gap insulates the heat source 100 from the thermally-expansive material 211A and 211B and reduces the amount of heat transferred from the heat source 100 to the heat conducting surface 180 through the thermally-expansive material 211A and 211B.

The following table provides the expansion properties and air gap distances provided by a silicone-based thermal material (e.g., CTE of $4\times10^{-4}$ ppm/° C.) as the thermal gel for various ambient temperatures (in ° C.). The thickness of the thermal gel represents the originally applied thickness (in microns) during manufacture of the apparatus. This original thickness may be determined by empirical research, based on the depth of the chamber area. Other thermal materials may have different properties:

| Ambient Temp (° C.) | Thickness of Thermal Gel (μm) | CTE of Thermal Gel (ppm/° C.) | Air Gap Distance (μm) |
|---|---|---|---|
| 40 | 500 | 4.00E-04 | 0.00 |
| 20 | 500 | 4.00E-04 | 4.00 |
| 0 | 500 | 4.00E-04 | 8.00 |
| −20 | 500 | 4.00E-04 | 12.00 |
| −40 | 500 | 4.00E-04 | 16.00 |

FIG. 2 is a diagram of an embodiment of operation of the adaptive heat dissipation apparatus 10 experiencing relatively high ambient temperatures. In such a high ambient temperature environment (e.g., >40° C.), the thermally-expansive material 211A and 211B in the one or more chamber volumes 110A-110B, expands to contact both the heat source 100 and the thermal coupling pad 120 (or the heat conducting surface 180 when the thermal coupling pad 120 is not used).

When the thermally-expansive material 211A and 211B expands to contact both the heat source 100 and the thermal coupling pad 120 (or heat conducting surface 180), the heat from the heat source 100 is conducted along paths 220A and 220B through the thermally-expansive material 211A and 211B to the thermal coupling pad 120 and/or heat conducting surface 180. The heat conducting surface 180 is then able to dissipate that conducted heat by radiation (via the radiation paths 230) into the ambient environment. Thus, any electronic component coupled to the apparatus 10 would not experience a high increase in heating since the heat is conducted away from the heat source 100 to the heat conducting surface 180 and radiated away from the component and into the environment.

FIG. 3 is a diagram of an embodiment of operation of the adaptive heat dissipation apparatus 10 experiencing relatively low ambient temperatures. In such a relatively low ambient temperature environment (e.g., <40° C., for example), the thermally-expansive material 211A-211B in the one or more chamber volumes 110A-110B contracts to create an air gap 310 between the heat source 100 and the thermally-expansive material (or within the thermal gel 210). Due to the air gap 310, the heat source 100 is insulated from the thermal coupling pad 120 or heat conducting surface 180 and heat does not efficiently radiate from the heat source 100. Thus, a significant portion of the heat is now retained in the heat source 100 and the retained heat is applied to any component adjacent to the heat source 100, such as illustrated in FIG. 4.

FIG. 4 is an embodiment of a circuit module 40 including the adaptive heat dissipation apparatus 10. The module 40 includes a component 400 (e.g., an electronic or photonic component). In an embodiment, the component 400 is an optics device (e.g., laser transmitter, light receiver). Other embodiments may use other components that use heating to improve the operating characteristics.

One or more heat sources 410A and 410B are on either side of the component 400. This orientation is shown for purposes of illustration as the heat sources 410A-410B may be located at different locations of the circuit module. The one or more heat sources 410A-410B may be immediately adjacent to the component 400 or coupled to the component 400.

The one or more heat sources 410A-410B are coupled to the top opening of the chamber volumes formed by chamber walls 440A, 440B, 440C, and 440D. The chamber walls 440A-440D may be present to keep the heat sources 410A-410B from contacting a metal shell 480. The chamber volumes are filled with the thermally-expansive material (e.g., thermal gel) 430. This embodiment does not show the thermal coupling pad of the other embodiments, but it may be used as well, and located between the thermal material 430 and the metal shell 480.

The illustrated embodiment is experiencing a relatively low ambient temperature so that an air gap 420 is formed between the heat sources 410A-410B and the thermal material 430. Thus, the heat from the heat sources 410A-410B is conducted directly into the component 400.

In another embodiment, such as illustrated in FIG. 2, the ambient temperature may be relatively high and the air gap 420 would disappear. As previously described, the thermal material 430 would conduct the heat from the heat sources 410A-410B to the metal shell 480 for radiation into the environment so that the electronic component 400 is not heated by the heat sources 410A-410B.

Figure 5:
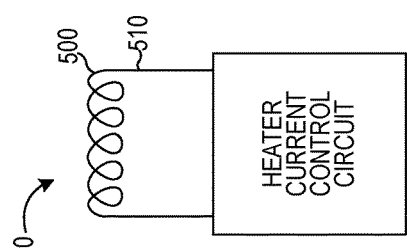
FIG. 5 is a block diagram of an embodiment of a heat source.

FIG. 5 is a block diagram of an embodiment of a heat source 100. This block diagram is for purposes of illustration only for one example of a heat source 100. Other types of heat sources (e.g., chemical) may be used to generate heat for the apparatus.

The illustrated heat source 100 is a resistive element 500 coupled to a heater current control circuit 510. The heater current control circuit 510 provides and controls a current through the resistive element 500. As the electric current through the resistive element 500 is caused to increase, the resistive element 500 heats up. Conversely, as the heater current control circuit 510 reduces the electric current through the resistive element 500, the resistive element 500 cools down.

The heat source 100 in some examples heats a laser (not shown). Some lasers used in fiber optic communications work best (and work most accurately) when kept at a constant temperature. Temperature variations can cause variations in the frequency or bandwidth of light generated by the laser. A substantially constant temperature is desired for the laser, so when ambient temperature is relatively low, it is desired that the heat generated by the heat source be applied to the laser, and not be conducted away and lost to the surroundings. In this situation, none of the heat generated by the heat source 100 should be conducted away by the adaptive heat dissipation apparatus 10. However, when the ambient temperature is relatively high, a portion of the generated heat will be conducted away by the adaptive heat dissipation apparatus 10, keeping the temperature of the laser constant and stable.

Figure 6C:
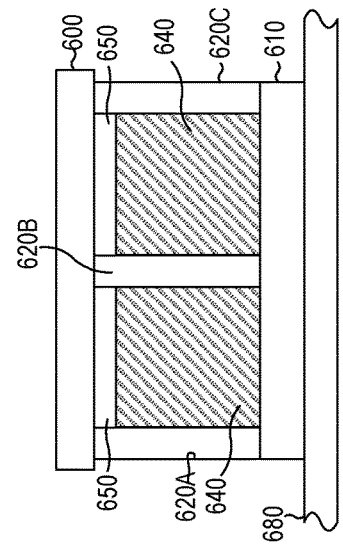
Figure 6B:
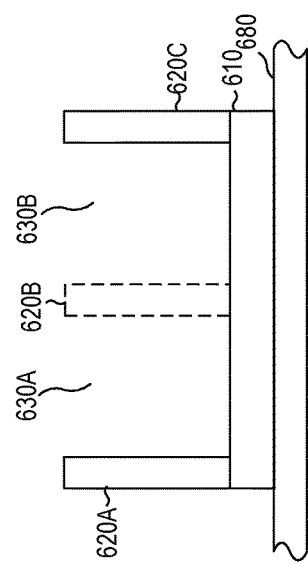

FIGS. 6A-6C are diagrams of various steps in manufacturing an embodiment of the adaptive heat dissipation apparatus. In FIG. 6A, an optional heat transferring material 610 (e.g., thermal coupling pad, paraffin wax, silicone-based material) may be formed on a heat conducting surface 680

(e.g., a metal shell). In FIG. 6B, chamber walls 620A, 620B, and 620C are formed on the heat transferring material 610, or on the heat conducting surface 680 if the heat transferring material 610 is not present. The chamber walls 620A-620C may be grown or deposited. The chamber walls 620A-620C form one or more chamber volumes 630A and 630B. As before, the chamber walls 620A-620C may be formed of a thermally-insulating material.

In FIG. 6C, the chamber volumes 630A and 630B are filled with a thermally-expansive material (such as a gel) 640 having a positive CTE that is configured to conduct heat. The quantity of gel 640 in the chamber volumes 630A-630B is determined so that air gap 650 separates the gel 640 from a heat source 600 during a first ambient temperature. In contrast, the thermally-expansive material 640 expands to contact the heat source 600 and the heat transferring material 610 (or the heat conducting surface 680) during a second ambient temperature that is greater than the first ambient temperature.

In the previous description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The description of example embodiments is, therefore, not to be taken in a limited sense, and the scope of the present invention is defined by the appended claims.

Although the present disclosure has been described with reference to specific features and embodiments thereof, it is evident that various modifications and combinations can be made thereto without departing from scope of the disclosure. The specification and drawings are, accordingly, to be regarded simply as an illustration of the disclosure as defined by the appended claims, and are contemplated to cover any and all modifications, variations, combinations or equivalents that fall within the scope of the present disclosure.

What is claimed is:

1. An adaptive heat dissipation apparatus comprising:
two or more chamber walls forming a chamber volume having a first open side and a second open side;
a heat source positioned at the first open side of the chamber volume;
a heat conducting surface positioned at the second open side of the chamber volume; and
a thermally-expansive material occupying a predetermined portion of the chamber volume, with the thermally-expansive material expanding to substantially fill the chamber volume at an ambient temperature above a predetermined temperature threshold and conducting heat from the heat source to the heat conducting surface, with the thermally-expansive material contracting to leave an air gap when the ambient temperature is below the predetermined temperature threshold.

2. The apparatus of claim 1, wherein the thermally-expansive material comprises a thermal conductivity in a range of about 100-500 Watts per meter Kelvin (W/mK).

3. The apparatus of claim 1, wherein the thermally-expansive material comprises a positive coefficient of thermal expansion in a range of about 100-400 parts per million per degree Celsius (ppm/° C.).

4. The apparatus of claim 1, wherein the thermally-expansive material comprises a thermal gel or a silicone-based gel including a heat conducting agent substantially distributed within the silicone-based gel.

5. The apparatus of claim 4, wherein the heat conducting agent comprises a metallic powder or a diamond powder.

6. The apparatus of claim 1, wherein the two or more chamber walls comprise a thermal insulator material or an oxide thermal insulator material.

7. The apparatus of claim 1, wherein the heat conducting surface further comprises a metal shell or a thermal coupling pad thermally coupling the metal shell to the thermally-expansive material.

8. The apparatus of claim 7, wherein the thermal coupling pad comprises an elastic thermally-conductive coupling pad.

9. A circuit module comprising:
an electronics component; and
an adaptive heat dissipation apparatus thermally coupled to the electronics component, the adaptive heat dissipation apparatus comprising:
two or more chamber walls forming a chamber volume having a first open side and a second open side;
a heat source positioned at the first open side of the chamber volume and immediately adjacent to the electronics component;
a heat conducting surface positioned at the second open side of the chamber volume; and
a thermally-expansive material occupying a predetermined portion of the chamber volume, with the thermally-expansive material expanding to substantially fill the chamber volume at an ambient temperature above a predetermined temperature threshold and conducting heat from the heat source to the heat conducting surface, with the thermally-expansive material contracting to leave an air gap when the ambient temperature is below the predetermined temperature threshold.

10. The circuit module of claim 9, wherein the electronics component comprises an optics device.

11. The circuit module of claim 9, wherein the heat source is immediately adjacent and thermally coupled with a first side of the electronics component and further comprising a second heat source immediately adjacent and thermally coupled with a second side of the electronics component.

12. The circuit module of claim 9, wherein the thermally-expansive material comprises a thermal conductivity in a range of about 100-500 Watts per meter Kelvin (W/mK).

13. The circuit module of claim 10, wherein the thermally-expansive material comprises a thermal gel.

14. The circuit module of claim 10, wherein the thermally-expansive material comprises a positive coefficient of thermal expansion in a range of about 100-400 parts per million per degree Celsius (ppm/° C.).

15. The circuit module of claim 10, wherein the thermally-expansive material comprises a thermal gel or a silicone-based gel including a heat conducting agent substantially distributed within the silicone-based gel.

16. The circuit module of claim 15, wherein the heat conducting agent comprises a metallic powder or a diamond powder.

17. The circuit module of claim 10, wherein the two or more chamber walls comprise a thermal insulator material or an oxide thermal insulator material.

18. The circuit module of claim 10, wherein the heat conducting surface further comprises a metal shell or a thermal coupling pad thermally coupling the metal shell to the thermally-expansive material.

19. The circuit module of claim 18, wherein the thermal coupling pad comprises an elastic thermally-conductive coupling pad.

20. A method for manufacturing an adaptive heat dissipation apparatus, the method comprising:
- forming two or more chamber walls, with the two or more chamber walls forming a chamber volume having a first open side and a second open side;
- positioning a heat source at the first open side of the chamber volume;
- positioning a heat conducting surface at the second open side of the chamber volume; and
- filling a predetermined portion of the chamber volume with a thermally-expansive material, with the thermally-expansive material expanding to substantially fill the chamber volume at an ambient temperature above a predetermined temperature threshold and conducting heat from the heat source to the heat conducting surface, with the thermally-expansive material contracting to leave an air gap when the ambient temperature is below the predetermined temperature threshold.

* * * * *